(12) United States Patent
Simkins et al.

(10) Patent No.: US 6,690,201 B1
(45) Date of Patent: Feb. 10, 2004

(54) METHOD AND APPARATUS FOR LOCATING DATA TRANSITION REGIONS

(75) Inventors: James M. Simkins, Park City, UT (US); Catalin Baetoniu, Toronto (CA); Nicholas J. Sawyer, Opio (FR)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/058,712

(22) Filed: Jan. 28, 2002

(51) Int. Cl.[7] .................... H03K 19/00; H03K 19/173; H03H 11/26
(52) U.S. Cl. ...................... 326/93; 326/37; 327/261
(58) Field of Search ................. 326/37, 93; 327/91, 327/94, 261, 263, 269, 271, 284; 341/122, 123

(56) References Cited

U.S. PATENT DOCUMENTS

| | | | |
|---|---|---|---|
| 4,841,551 A | * 6/1989 | Avaneas | 375/371 |
| 5,022,056 A | * 6/1991 | Henderson et al. | 375/373 |
| 5,278,873 A | * 1/1994 | Lowrey et al. | 375/371 |
| 5,416,807 A | * 5/1995 | Brady et al. | 375/356 |
| 5,532,632 A | * 7/1996 | Kent | 327/141 |
| 5,546,018 A | 8/1996 | New et al. | |
| 6,122,720 A | 9/2000 | Cliff | |
| 6,239,629 B1 | * 5/2001 | Erickson | 327/141 |
| 6,326,812 B1 | 12/2001 | Jefferson | |

* cited by examiner

*Primary Examiner*—James H Cho
(74) *Attorney, Agent, or Firm*—W. Eric Webostad

(57) ABSTRACT

Method and apparatus for data sampling is described. More particularly, a data sampling circuit having a delay line and a plurality of tap circuits is used to sample data and provide a vector indicative of a transition region of a sampled input signal. Additionally, a hybrid sampling circuit is described with a fine grain delay line and coarse grain delay lines. Furthermore, a controller is described for using such a vector to control which data samples are used.

24 Claims, 6 Drawing Sheets

METHOD AND APPARATUS FOR LOCATING DATA TRANSITION REGIONS

FIELD OF THE INVENTION

The present invention relates generally to locating data transition regions, and more particularly to using located data transition regions in a programmable logic device to improve performance.

BACKGROUND OF THE INVENTION

Programmable logic devices exist as a well-known type of integrated circuit that may be programmed by a user to perform specified logic functions. There are different types of programmable logic devices, such as programmable logic arrays (PLAs) and complex programmable logic devices (CPLDs). One type of programmable logic devices, called a field programmable gate array (FPGA), is very popular because of a superior combination of capacity, flexibility and cost.

An FPGA typically includes an array of configurable logic blocks (CLBs) surrounded by a ring of programmable input/output blocks (IOBs). The CLBs and IOBs are interconnected by a programmable interconnect structure. The CLBS, IOBs, and interconnect structure are typically programmed by loading a stream of configuration data (bitstream) into internal configuration memory cells that define how the CLBS, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

Even though FPGAs are very flexible and can be used to implement many circuits, they have some performance limitations, such as longer signal delays and lower gate counts. These limitations hinder use of FPGAs on high-speed applications, namely, those applications with real-time processing of information.

For example, communication circuits move data at rates of speed in excess of 622 million bits per second (Mbps). Reliable serial data sampling at speeds over 622 Mbps is difficult in part due to clock and data jitter and skew, as well as data-to-data skew on a wide bus (8 or more bits wide) and inter-symbol interference. Conventionally, all channels have been sampled synchronously. For example, in a source synchronous application, data is provided in parallel with a respective clock signal. Though this forwarded clock signal will not be exactly in-phase and in-frequency with the internally generated sampling clock derived from the forwarded clock via a DCM/PLL/DLL with inherent increase in sampling jitter. Accordingly, this makes it difficult to process data in parallel due to misalignment of data bits. Moreover, higher data rates continue to narrow the data-sampling window. Alternatively, asynchronous data sampling may be used. However, asynchronous data sampling still needs to be reliable to associate data to a non-transition area, and asynchronous data sampling operates at speeds proximal or equal to the data rate.

For these high-speed applications, application specific integrated circuits (ASICs) or application specific standard products (ASSPs) have conventionally been used. Unfortunately, communication circuits implemented as ASICs or ASSPs have several disadvantages. One such disadvantage is the time-to-market risks associated with the relatively long cycle time necessary for the implementation of a new ASIC design. An additional disadvantage of using ASICs for communication circuits is that ASICs are "hard-wired" and thus conventionally are not reconfigurable for a new application or application upgrade.

Accordingly, it would be desirable and useful to provide a programmable logic device that was capable of handling such high-speed data rates. Moreover, it would be desirable and useful to provide such a solution that would work in a synchronous or asynchronous context, whether in a programmable logic device or other integrated circuit, including, but not limited to, ASICs and ASSPs.

SUMMARY OF THE INVENTION

An aspect of the present invention is a data sampling circuit. More particularly, a delay line is provided along with a plurality of tap circuits coupled to the delay line. The plurality of tap circuits is coupled at locations for progressively delaying an input data signal. A tap circuit of the plurality of tap circuits comprises a sampling device and a metastable recovery device. The sampling device and the metastable recovery device are coupled in series and configured to receive, sample and stabilize the input data signal progressively delayed. Accordingly, outputs from the plurality of tap circuits provide at least a portion of a vector indicative of a transition region of the input data signal.

An aspect of the present invention is a hybrid data sampling circuit. More particularly, a first delay line is provided having a series of gates and having a first plurality of nodes interspersed between the gates. The first plurality of nodes is located for tapping a progressively delayed input signal with a first granularity. A plurality of second delay lines is coupled to the first plurality of nodes. The plurality of second delay lines has a second plurality of nodes located for tapping the progressively delayed input signal with a second granularity. A plurality of tap circuits is coupled to the second plurality of nodes. The plurality of tap circuits includes a sampling device and a metastable recovery device, where the sampling device and the metastable recovery device are coupled in series and configured to receive, sample and stabilize the progressively delayed input signal. Accordingly, outputs from the plurality of tap circuits provide at least a portion of a vector indicative of a transition region of the input data signal.

An aspect of the present invention is a method for determining a transition region of an input signal. More particularly, the input signal is progressively delayed. The input signal progressively delayed is tapped at a plurality of locations to provide a plurality of progressively delayed versions of the input signal. The plurality of progressively delayed version of the input signal is sampled to provide at least a portion of a vector indicative of the transition region of the input signal.

An aspect of the present invention is a method for determining a transition region of an input signal. More particularly, the input signal is progressively delayed. The input signal progressively delayed is tapped at a first plurality of locations to provide a first plurality of progressively delayed versions of the input signal of a first granularity. The first plurality of progressively delayed versions of the input signal of the first granularity is progressively delayed to provide a second plurality of progressively delayed versions of the input signal of a second granularity. The second plurality of progressively delayed versions of the input signal of the second granularity is tapped at a second plurality of locations. The second plurality of progressively delayed version of the input signal of the second granularity is sampled to provide at least a portion of a vector indicative of the transition region of the input signal.

An aspect of the present invention is a method for timing signal data recovery. More particularly, falling data samples and rising data samples are obtained, and the falling data samples are moved to a domain of the rising data samples. The falling data samples and the rising data samples are processed in sequential pairs, and data transition region information is determined from the sequential pairs. The data transition region information is provided to a state machine and processed with the state machine to obtain output therefrom.

BRIEF DESCRIPTION OF THE DRAWINGS that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the present invention may admit to other equally effective embodiments.

DETAILED DESCRIPTION OF THE DRAWINGS

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
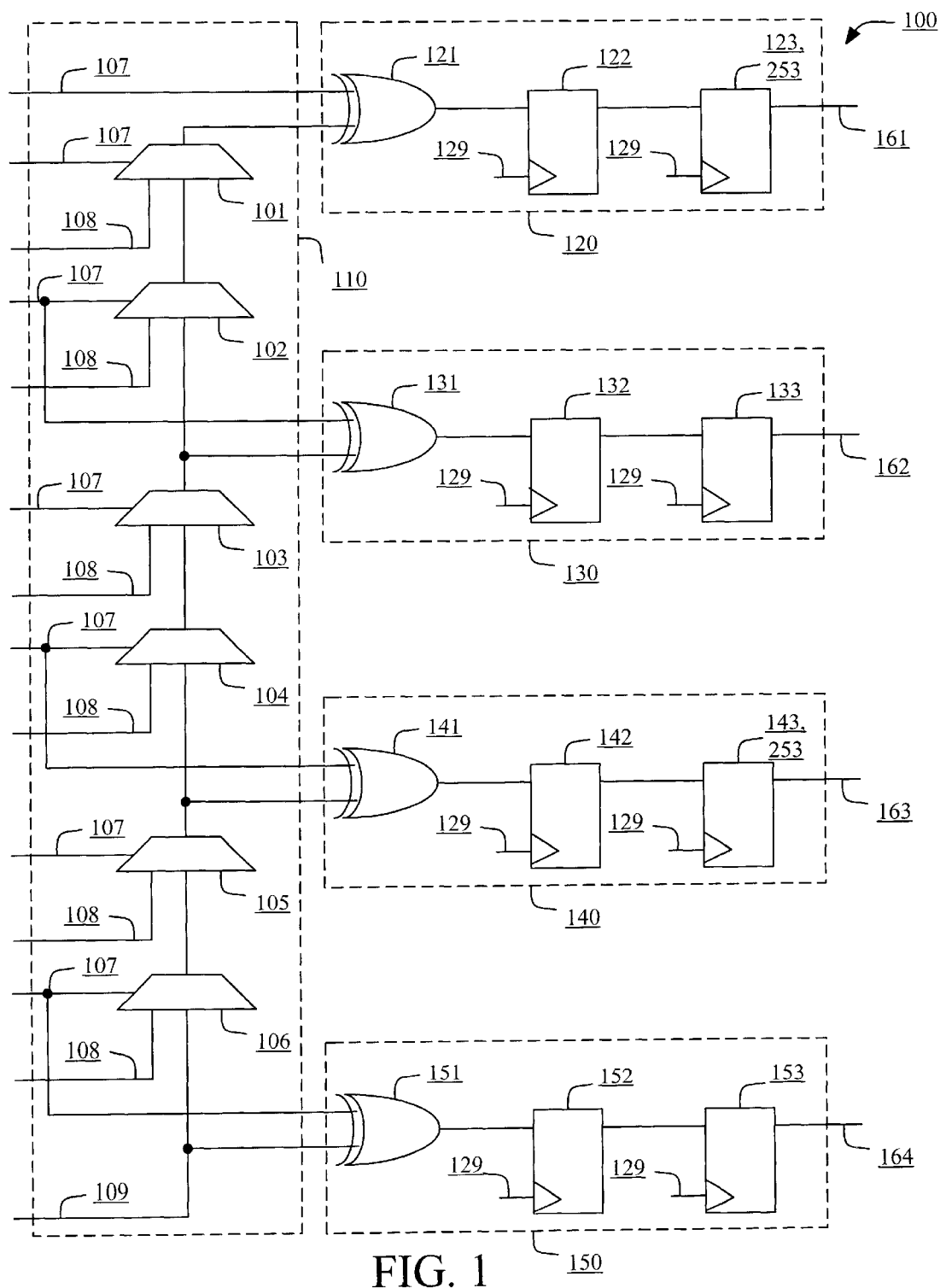
FIG. 1 is a schematic diagram of an exemplary portion of an embodiment of a data sampling circuit in accordance with one or more aspects of the present invention.

Referring to FIG. 1, there is shown a schematic diagram of an exemplary portion of an embodiment of a data sampling circuit 100 in accordance with one or more aspects of the present invention. Data sampling circuit 100 comprises delay line circuit 110 and tap circuits 120, 130, 140, and 150. Though four taps are shown, fewer or more tap circuits may be used depending on desired granularity and on data period.

Delay line circuit 110, or more particularly analog delay line circuit 110, comprises multiplexers 101, 102, 103, 104, 105, and 106 ("multiplexers 101 through 106"). Select or control input to multiplexers 101 through 106 is a logic level voltage 107, such as Vcc. Data input 108 to multiplexers 101 through 106 is a logic level voltage, such as ground. In this manner, multiplexers 101 through 106 are for passing data input signal 109 through as a selected output. Data input signal 109 passes through multiplexers 101 through 106, and each such multiplexer introduces a delay to data input signal 109. Data input signal 109 is provided directly to exclusive OR (XOR) gate 151, and thus is not delayed by passing through one of multiplexers 101 through 106. Accordingly, data input signal 109 arrives at XORs 151, 141, 131, and 121 at different times, which are progressively delayed with respect to one another. Though two multiplexers are shown between taps, it should be understood that one multiplexer or more than two multiplexers between taps may be used.

This cascading of multiplexers for progressive delays may be implemented in a programmable logic device. More particularly, such implementation may be done with deterministic—hardwired—circuitry, as opposed to programmable circuitry. By using deterministic circuitry, consistency of delay is enhanced. More particularly, data sampling circuit 100 may be implemented in a CLB of an FPGA. Notably, a slice of an FPGA comprises two multiplexers, an XOR and two flip-flops.

In some programmable logic devices, each multiplexer 101 through 106 provides a delay of approximately 50 picoseconds or less. Thus, each stage has a delay of approximately 100 picoseconds or less. Notably, temperature and voltage may affect actual delay. In optimal conditions, delay by each multiplexer 101 through 106 may be approximately 20 picoseconds. Accordingly, delay chain or line circuit 110 may be sufficiently long to allow for a data period according to range of delay for multiplexers 101 through 106.

Data input signal 109 is provided to XORs 151, 141, 131, and 121 along with logic level voltage signal 107, namely, Vcc, for each tap circuit 150, 140, 130, and 120. Thus, each XOR 151, 141, 131, and 121 provides as an output an inverted data input signal 109. There are two flip-flops in each tap circuit 150, 140, 130, and 120. These may be delay type flip-flops. The first flip-flops, flip-flops 122, 132, 142, and 152, are data sampling flip-flops.

A clock or strobe signal 129 is provided to each of flip-flops 122, 132, 142, and 152. Notably, though a global clock or strobe signal is used for all flip-flops to reduce skew, it should be understood that differing clock or strobe signals may be used. Clock or strobe signal 129 optionally may be complemented to provide an inverted clock signal to flip-flops. For example, flip-flops 152 and 132 may sample or toggle on a rising edge of data input signal 109, and flip-flops 142 and 122 may sample on a falling edge of data input signal 109. Whether there is sufficient setup time between alternating rising and falling edge triggered flip-flops within a tap circuit is dependent on speed of such flip-flops and frequency of operation.

Though only one flip-flop 122, 132, 142, and 152 may be used in each of tap circuits 120, 130, 140, and 150, respectively, a second or metastable recovery flip-flop may be added. Flip-flops 123, 133, 143, and 153 are coupled to respective outputs of flip-flops 122, 132, 142, and 152 in order to provide metastable recovery. Thus, by using two flip-flops in series in each tap circuit 120, 130, 140, and 150, double synchronization and double sampling is used, as opposed to single synchronization and single sampling by using only one flip-flop in each such tap circuit.

Notably, each clock or strobe signal 129 to flip-flops 123, 133, 143, and 153 is not complemented. In other words, rising edge sampling is used for these flip-flops 123, 133, 143, and 153. This is done to ensure flip-flop outputs 161, 162, 163, and 164 are all in a same domain, such as a rising edge domain. Such a configuration is appropriate for applications like pin-pin deskew.

Accordingly, it should be appreciated that tap stage outputs 161, 162, 163, and 164 provide a vector of a sampled data input signal 109. This vector may be used to provide an indication of where transitions in such sampled data may be occurring. The number of taps in a delay line and delay between such taps establishes a sampling granularity to find data transitions. Such data transition information may be used to determine which data samples to use. Notably, if data sampling circuit 100 were implemented in an FPGA, one tap per slice may be used for providing a "monotonic delay."

Thus, by using such data transition information, data sampling may intelligently be moved toward or stay in a non-transitioning region of a data bit for enhanced reliability of data recovery. This is especially important in systems suffering from some of the above-mentioned problems, including, but not limited to, intersymbol interference. Moreover, delay line 110 may be configured for data sampling on both rising and falling edges, such as in double data rate (DDR) applications, or for data sampling on just one edge, such as a rising edge, for single data rate (SDR) applications. Data sampling circuit may be used for pin deskew, as delay line 110 may be scaled, such as longer than a data period, for such an application. Notably, for DDR, delay line 110 length is doubled, namely, two data periods. Data sampling circuit 100 may be used for clock data recovery in DDR or SDR applications. Furthermore, alternating rising and falling edge sampling at sequential tap locations may reduce logic needs for applications that move in a one-half data period step from a data transition edge. In other words, delay line 110 may be only so long as to sample one-half of a data period.

Advantageously, by using taps as described above, over sampling may be done without having to have a sampling frequency in excess of a data frequency. For example, conventionally to do 10× oversampling of a 1 GHz signal, a 10 GHz frequency for the sampling signal would be needed. However, in accordance with an aspect of the present invention, 10 samples may be taken with in each data period by having 10 taps. Thus, 10× over sampling may be done using a frequency of approximately the data signal.

Moreover, because analog delay line 110 provides "fine grain" delay line taps, representing a factor of approximately 8 to 16 taps per bit period, channel bit deskew operations may be performed to compensate for board level skew of data lines on a data bus. In other words, parallel or serial data on data lines may be aligned or realigned to a clocking signal.

Figure 1A:
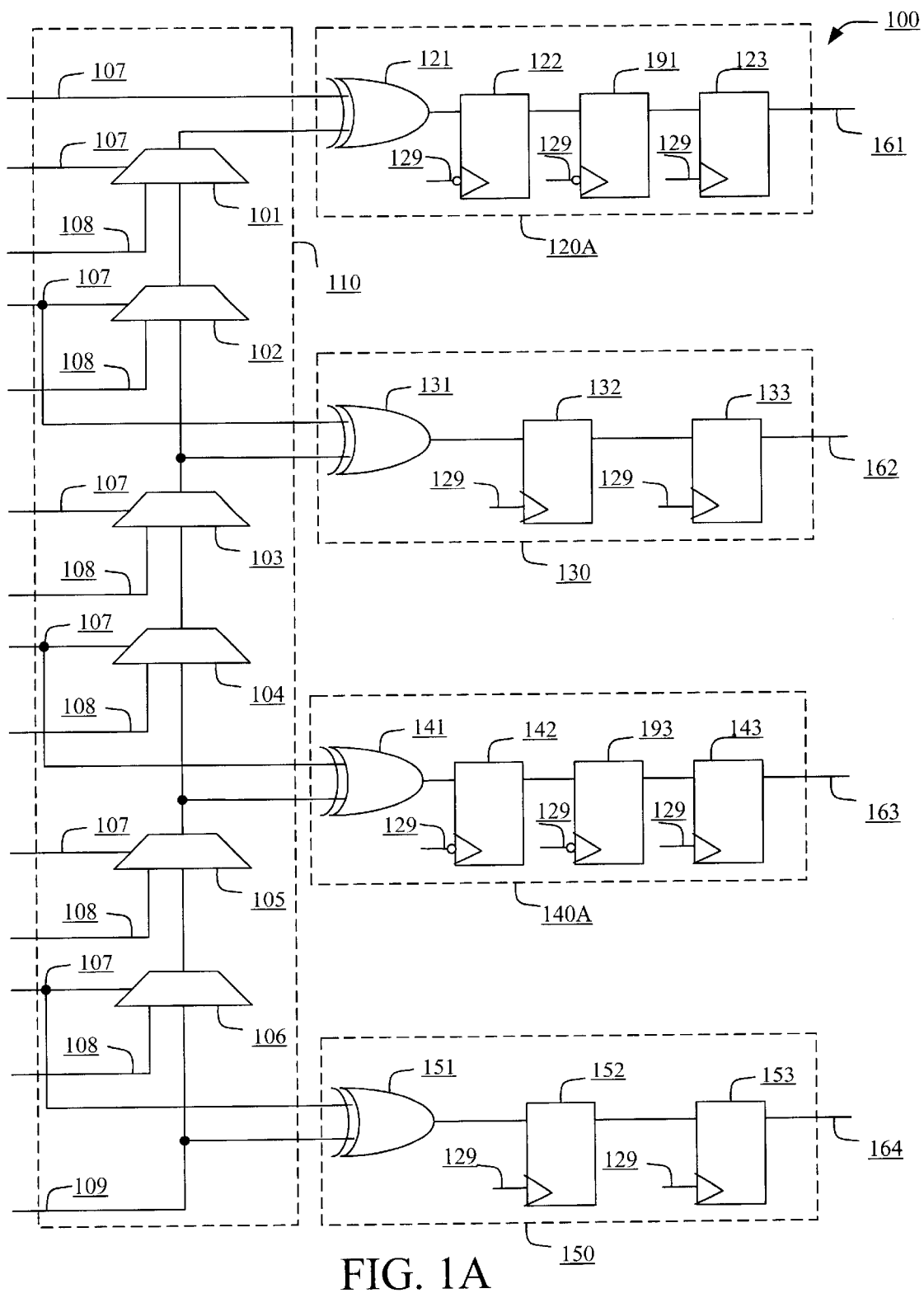
FIG. 1A is a schematic diagram of an exemplary portion of an alternative embodiment of data sampling circuit of FIG. 1.

Referring to FIG. 1A, there is shown a schematic diagram of an exemplary portion of an alternative embodiment of data sampling circuit 100 of FIG. 1. In stages 120A and 140A of FIG. 1A, an additional flip-flop 191 and 193, respectively, has been added. Flip-flops 191 and 193 are coupled to receive respective outputs of flip-flops 122 and 142 and to provide respective inputs to flip-flops 123 and 143. Flip-flops 191 and 193 are configured for falling edge sampling as described above. Accordingly, data input signal 109 for falling edge sampling stages 120A and 140A is triple synchronized and sampled.

Figure 2:
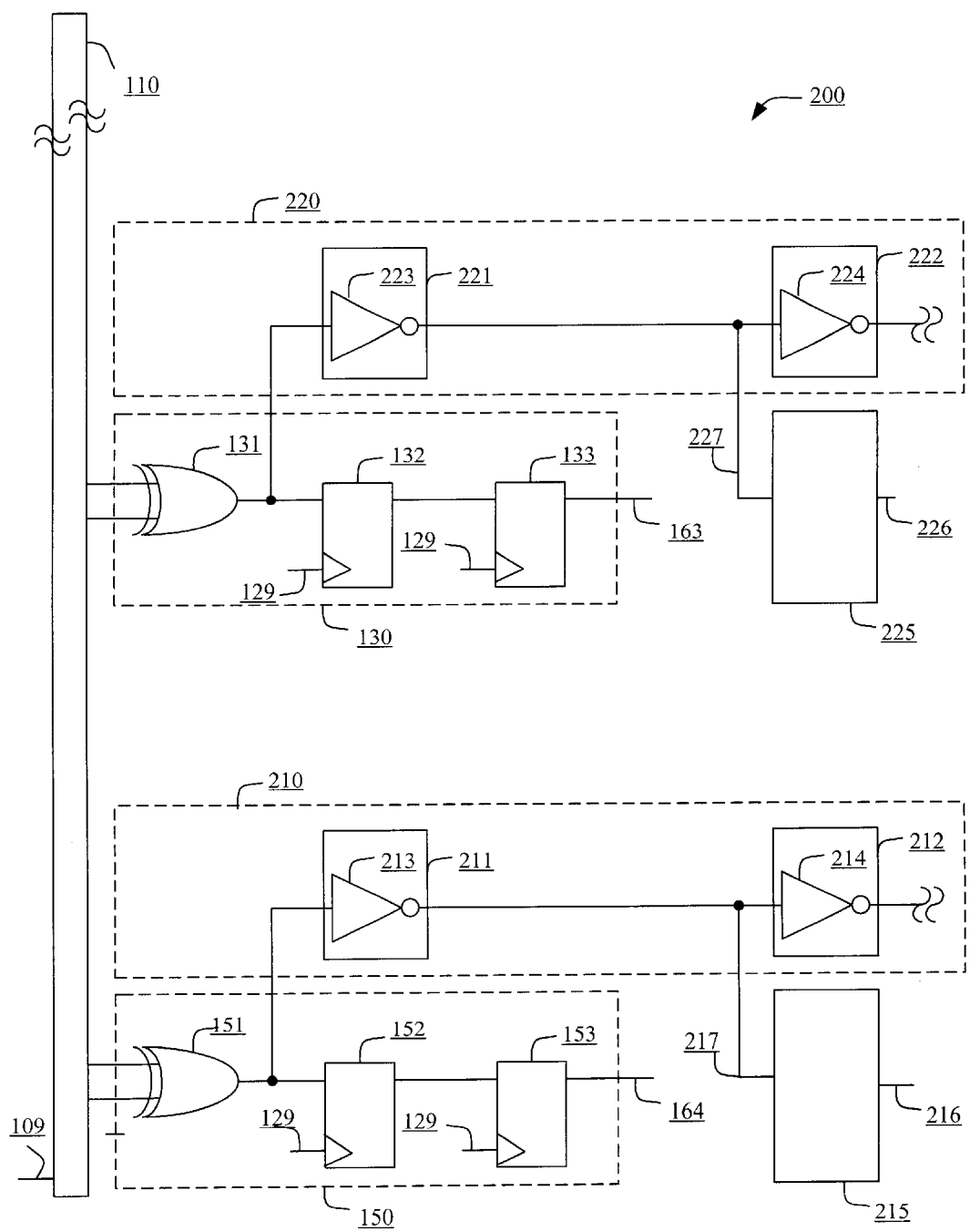
FIG. 2 is a block/schematic diagram of an exemplary portion of an embodiment of a data sampling circuit in accordance with one or more aspects of the present invention.

Referring to FIG. 2, there is shown a block/schematic diagram of an exemplary portion of an embodiment of a data sampling circuit 200 in accordance with one or more aspects of the present invention. Delay line 110 is to provide more granular delays ("fine grain") delays than delay lines 210 and 220 ("coarse grain"). "Coarse grain" delay lines 210 and 220 each comprise in series respective look-up tables (LUTs) 211, 212 and 221, 222. Delay chains 210 and 220 are characterized as "coarse grain" because they have approximately four times the delay of a "fine grain" delay line. Conventionally, LUTs comprise configurable logic, which is configurable such that rise and fall time variations cancel with one another. As shown, LUTs 211, 212 and 221, 222 may be configured to function as inverters 213, 214 and 223, 224. Moreover, by using fast connect resources in an FPGA, routing delays between LUTs may be held to less than approximately 5 picoseconds and provide a more deterministic delay.

Taps 217 and 227 are taken from delay chains 210 and 220, respectively, and provided to tap circuits 215 and 225 respectively. Tap circuits 215 and 225 provide respective sampled data outputs 216 and 226. Sampled data outputs 216 and 226 are similar to sampled data outputs 164 and 163, respectively, except delayed due to LUTs 211 and 221, respectively. Accordingly, off of taps of a coarse grain delay line 210 or 220, a coarse grain vector, such as outputs 164, 216 and so on, of sampled data may be obtained. Notably, each coarse grain vector is provided from a same fine grain delay line 110. Thus, coarse grain line 210 is delayed with respect to coarse grain line 220. Coarse grain line 210 and 220 may be long enough to cover one or more data periods.

A coarse grain delay line is more suitable for low frequency operation and consumes less logic resources than a fine grain delay line. A fine grain delay line is more suitable for high frequencies of operation and channel bit deskew. A hybrid circuit is suitable for high frequency, channel bit deskew, and consumes less logic than fine grain.

Figure 2A:
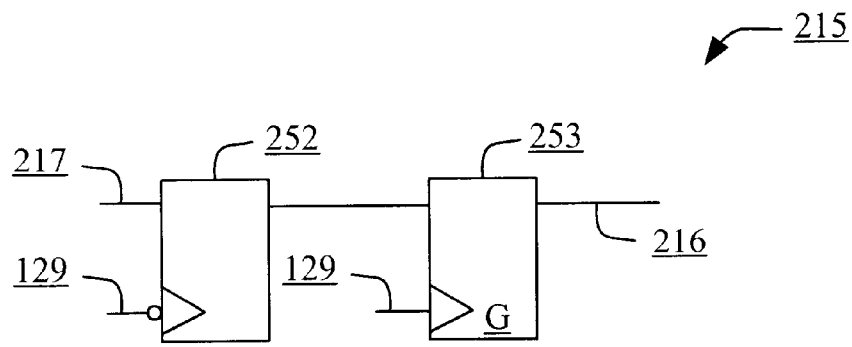
FIG. 2A is a schematic diagram of an embodiment of a tap circuit in accordance with one or more aspects of the present invention.

Tap circuits 150 and 130 may be configured for rise time sampling, and tap circuits 215 and 225 may be configured for fall time sampling. Referring to FIG. 2A, there is shown a schematic diagram of an embodiment of a tap circuit 215, or 225 for that matter, in accordance with one or more aspects of the present invention. Flip-flop 252 is configured the same as flip-flop 142; however, rather than a flip-flop 143, a latch 253 is used. Because sampling on a fall time followed by sampling on a rise time only allows a one-half data period window, setup time for a second flip-flop may not be sufficient. Accordingly, latch 253 is used owing to not needing as much setup time as a flip-flop. Furthermore, latch 253 may be used instead of a metastablization flip-flop in data sampling circuit 100 of FIG. 1 for the above-stated reasons.

Figure 3:
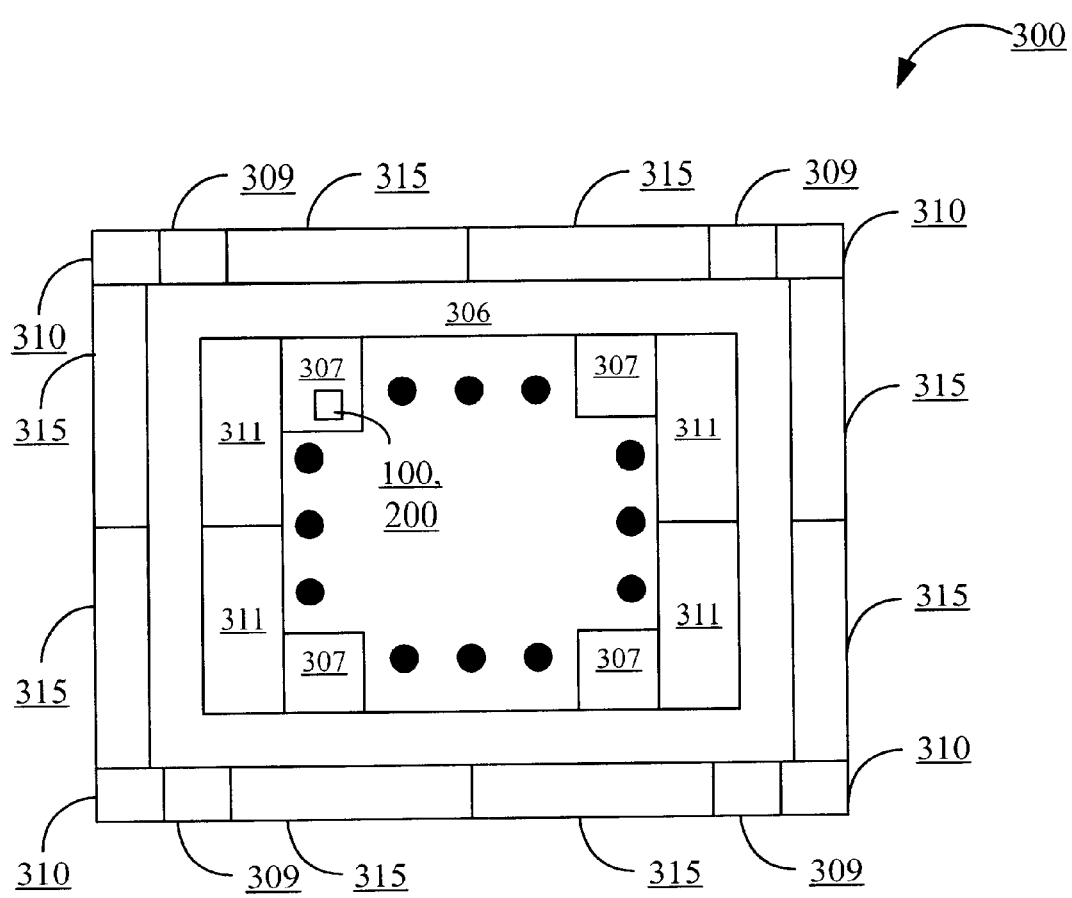
FIG. 3 is an exemplary embodiment of an FPGA in accordance with one or more aspects of the present invention.

Referring to FIG. 3, there is shown an exemplary embodiment of an FPGA 300 in accordance with one or more aspects of the present invention. FPGA 300 comprise configuration logic blocks 307, programmable input/output (I/O) blocks 315, I/O routing ring 306. FPGA 300 further comprises memory 311, which may be random access memory, for storing configuration information or configuring programmable gates of CLBs 307. FPGA further comprises delay lock loops (DLLs) 309 and digital clock module (DCM) 310 comprising multiply/divide/deskew clock circuits. Data sampling circuit 100 or 200 or both may be located in FPGA 300, for example in a CLB 307.

As mentioned above, a clock signal or a strobe signal may be used. This is because asynchronous, in addition to synchronous, operation may be used in accordance with one or more aspects of the present invention. Accordingly, a free running clock, not part of an SDR or DDR clock-forwarding scheme, may be used for synchronizing flip-flops. In a DDR synchronous dynamic random access memory (SDRAM) interface, only a strobe is available to capture data. This strobe occurs non-periodically and only occurs during data nibble mode.

Conventional clock data synchronization systems (CDSs) require a continuous forwarded clock to operate a delay-lock loop (DLL) or phase-lock loop (PLL) in a DCM.

However, by treating such a strobe signal as a data input signal 109, it is possible to capture where strobing occurs using a data sampling circuit 100 or 200. Output from data sampling circuit 100 or 200 may be used to select a correct tap in each data line corresponding to where a strobe occurs, provided such a free-running clock and analog delay line 110 are scaled to cover a bit period of an incoming data bus. Moreover, a clock signal may be provided as data input signal 109 to calibrate length of delay line 110 to account for changes in performance of delay line 110 due to temperature variations.

With renewed reference to FIGS. 1, 1A and 2A, as mentioned above, input signal 109 may be a clock or strobe, such as a clock or strobe provided along with data. Rather than forwarding such a clock or strobe, it is provided as input signal 109. Edges for such a timing input signal 109 may be detected. A vector output from data sampling circuit 100 or 200 indicates how many taps were needed to capture this timing input signal 109. Thus, the clock or strobe period and the number of taps needed cover a data period are obtained from such an output vector. In other words, the value in units of time of each tap is known.

A sampling strobe or clock should be at least as fast, if not five to ten percent faster, than an incoming data strobe or clock in order to not miss any data. Accordingly, with knowledge of the number of taps needed to capture data, a strobe or a free running clock or global clock may be used to replace an incoming data clock. A carry chain is made to accommodate various data periods and changes in element delays. By sampling an incoming timing signal, it is possible to know how many taps to use to sample data. Moreover, a delay line is affected by voltage and temperature, so delays of delay elements will vary with changes in these conditions. Accordingly, by sampling an incoming timing signal, changes in delays are taken into account. It should be understood that strobe or clock skew incurred in distribution to all sample flip-flops should be less then a tap delay on the carry chain. Sampling methods herein described, avoid the need of using a PLL or DLL, and thus advantageously avoids jitter associated with such loops.

Figure 4:
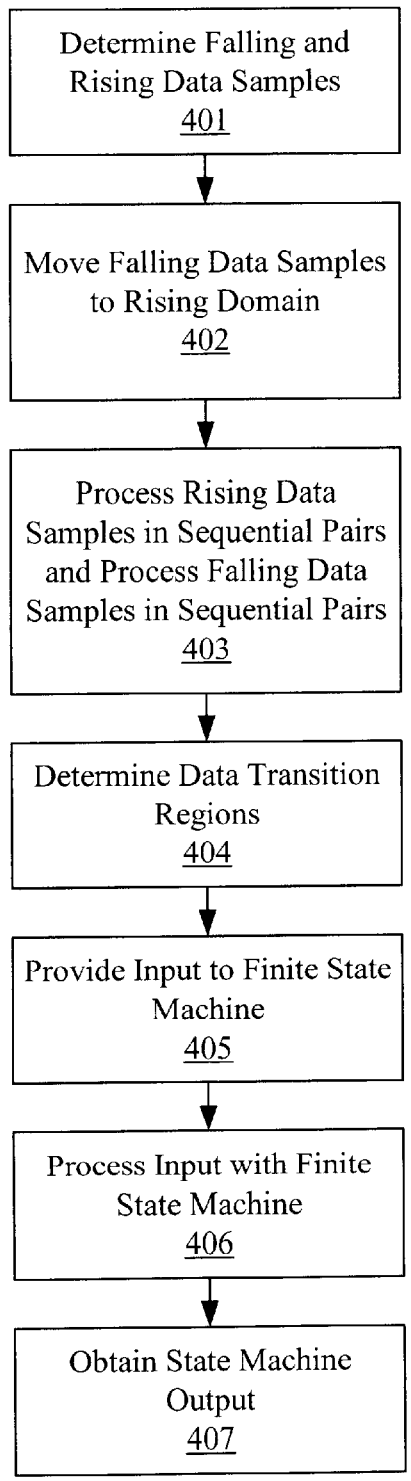
FIG. 4 is a flow diagram of an exemplary embodiment of a controller process for processing sampled data in accordance with one or more aspects of the present invention.

A controller is used to sort through a captured data vector from data sampling circuit 100 or 200 to determine data transitions and move away from a sampled data transition region toward a non-transitioning area of a data bit. Referring to FIG. 4, there is shown a flow diagram of an exemplary embodiment of a controller process 400 for processing sampled data, such as from a data sampling circuit 100 or 200, in accordance with one or more aspects of the present invention. At step 401, falling and rising data samples are obtained, such as from sampling circuit 100 or 200. For purposes of explanation, it assumed that seven samples of falling edge triggered sampling (falling samples) and seven samples of rising edge-triggered sampling (rising samples) are taken. However, fewer or more samples may be used.

At step 402, falling samples are moved into the rising sample domain. At step 403, rising and falling data samples are processed in sequential pairs. At step 404, data transition regions are determined, and inputs for a state machine are provided at step 405. To illustrate steps 403, 404 and 405, Tables I and II show how falling samples (F1 through F7) are paired and processed.

TABLE I

| Sequential Falling Pair | Resultant Sample |
|---|---|
| F1, F2 | F1 ⊕ F2 |
| F2, F3 | F2 ⊕ F3 |
| F3, F4 | F3 ⊕ F4 |
| F4, F5 | F4 ⊕ F5 |
| F5, F6 | F5 ⊕ F6 |
| F6, F7 | F6 ⊕ F7 |

TABLE II

| Resultant Sample | Finite State Machine Input |
|---|---|
| (F1 ⊕ F2) + (F2 ⊕ F3) | Left Error Falling Edge ("Edge (2)") |
| (F3 ⊕ F4) + (F4 ⊕ F5) | Middle Error Falling Edge ("Edge (4)") |
| (F5 ⊕ F6) + (F6 ⊕ F7) | Right Error Falling Edge ("Edge (6)") |

Thus, sample F1 is XOR'd with sample F2, sample F2 is XOR'd with sample F3, and so on. Resultant samples from XORing are then OR'd, so the resultant of F1 XOR'd with F2 is OR'd with the resultant of F2 XOR'd with F3, as shown in Table II. For purposes of completeness, Tables III and IV are provided for rising edge inputs or samples (R1 through R7).

TABLE III

| Sequential Falling Pair | Resultant Sample |
|---|---|
| R1, R2 | R1 ⊕ R2 |
| R2, R3 | R2 ⊕ R3 |
| R3, R4 | R3 ⊕ R4 |
| R4, R5 | R4 ⊕ R5 |
| R5, R6 | R5 ⊕ R6 |
| R6, R7 | R6 ⊕ R7 |

TABLE IV

| Resultant Sample | Finite State Machine Input |
|---|---|
| (R1 ⊕ R2) + (R2 ⊕ R3) | Left Error Rising Edge ("Edge (1)") |
| (R3 ⊕ R4) + (R4 ⊕ R5) | Middle Error Rising Edge ("Edge (3)") |
| (R5 ⊕ R6) + (R6 ⊕ R7) | Right Error Rising Edge ("Edge (5)") |

Finite state machine inputs are characterized by region of a data bit period. For example, if a transition was detected in the approximate middle third of a data period on a falling edge transition, middle error falling edge or Edge(4) would equal 1, or ME=1 for short. If a transition was detected in the approximate middle third of a data period on a rising edge transition, middle error rising edge or Edge(3) would equal 1, or ME=1 for short. Notably, in both examples, ME=1. Accordingly, "error" inputs or transition region indicators to a state machine may be described as, LE=1, when Edge(1) or Edge(2) equals 0, else LE=0
ME=1, when Edge(3) or Edge(4) equals 0, else ME=0
RE=1, when Edge(5) or Edge(6) equals 0, else RE=0

In other words, if a transition or "error" (E) is detected on a rising or a falling edge in an approximate left (L), middle (M), or right (R) third of a data period, or other period under consideration, then LE, ME, or RE, respectively, will equal 1. And, if no transition is detected on a rising or a falling edge in an approximate left third, middle third, or right third of a data period, or other period under consideration, then LE, ME, or RE, respectively, will equal 0.

Figure 5:
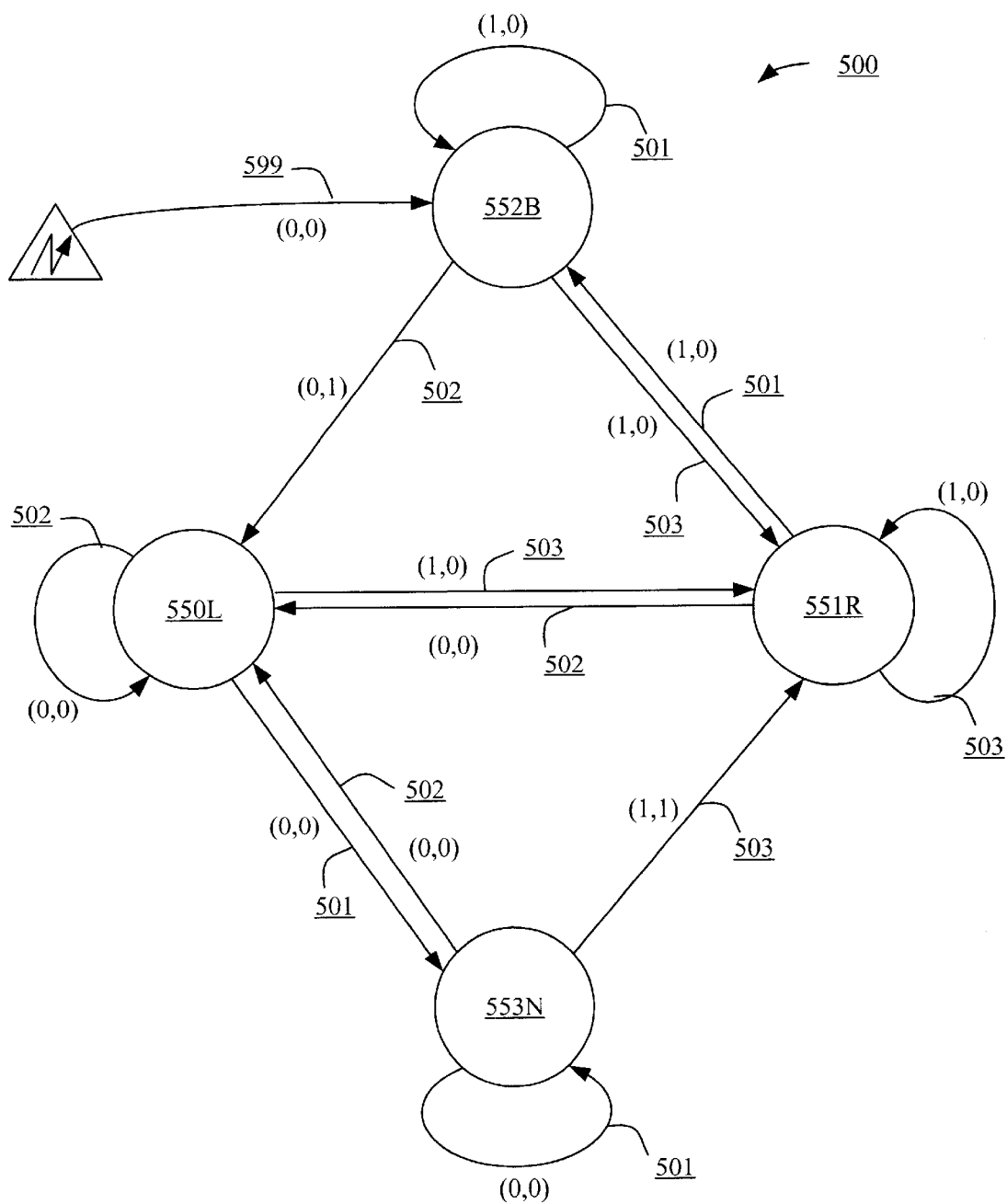
FIG. 5 is a state diagram of an embodiment of a state machine in accordance with one or more aspects of the present invention.

Once inputs for a state machine are generated at step 405, such inputs are process by such a state machine at step 406. Referring to FIG. 5, there is shown a state diagram of an embodiment of a state machine 500 in accordance with one or more aspects of the present invention. State machine 500 is shown for a DDR application to explain asynchronous operation. In a DDR embodiment, two data bits are produced on every DDR strobe cycle, and these two data bits are taken the opposite end of a carry chain from where a bit transition is detected. If a receive clock, such as clock signal 129 in FIG. 1, is faster than DDR data rate, only one bit is generated when phase skip ("SKIP") occurs. If a receive clock, such as clock signal 129 in FIG. 1, is slower than DDR data rate, three bits are generated when phase skip occurs. Thus, transition edges may move from left to right or right to left depending on clock speed due to phase wrap around.

In state machine 500, transitions 501 are for ME=1, transitions 502 are for RE=1, and transitions 503 are for LE=1. Transition 599 is a reset, or RESET=1. State 550L is a state where a left region of a data period is used. In other words, left data samples are used as transitions are not occurring in an approximate left third of a period under consideration. State 551R is a state where a right region of a data period is used. States 552B and 553N are intermediate states for clock signal 129, and occur in part due to a sampling strobe being faster or slower, respectively, than a data rate.

State machine 500 has two outputs, namely, RnL and SKIP. As mentioned above, SKIP is for when a phase skip occurs. Thus, SKIP is set to 0 when two data samples are produced, and SKIP is set to 1 when one or three data samples are produced. RnL ("Right and Left") is set to 0 when a left state is to be used, and RnL is set to 1 when a right state is to be used. Accordingly, an output table for state machine 500 may be expressed as in Table V.

TABLE V

| RnL | SKIP | Result |
| --- | --- | --- |
| 0 | 0 | Use 2 Left Data Samples |
| 1 | 0 | Use 2 Right Data Samples |
| 0 | 1 | Use 3 Data Samples |
| 1 | 1 | Use 1 Data Sample |

Outputs (RnL,SKIP) are shown in FIG. 5 for each transition. For example, on reset 599, RnL and SKIP are each set to zero, and intermediate state 552B is reached. At intermediate state 552B, if ME=1, that state is maintained and RnL is set to 1. If, however, RE=1 or LE=1, a transition to state 550L or 551R, respectively, is made and SKIP is set to 1 or RnL is set to 1, respectively.

If state machine 500 is in left state 550L, meaning using the approximate left third of a sampled period, it stays in such a state if RE=1, and RnL and SKIP are set to zero. State machine 500 transitions from state 550L if LE=1, then state machine 500 goes to state 551R, or if ME=1, then state machine 500 goes to state 553N. For transition 503 from state 550L to state 551R, RnL is set to 1.

If state machine 500 is in right state 551R, meaning using the approximate right third of a sampled period, it stays in such a state if LE=1, and RnL is set to 1 and SKIP is set to 0. State machine 500 transitions from state 551R if RE=1, then state machine 500 goes to state 550L, of if ME=1, then state machine 500 goes to state 552B. For transition 502 from state 551R to state 550L and for transition 501 from state 551R to state 552B, RnL is set to 1.

If state machine 500 is in intermediate state 553N, it stays in such a state if ME=1, and RnL and SKIP are set to 0, meaning using the left two data samples. State machine 500 transitions from state 553N if RE or LE equals 1. If RE=1, state machine 500 transitions 502 from state 553N to state 550L. If LE=1, state machine 500 transitions 503 from state 553N to state 551R, and RnL and SKIP are set to 1.

In short, state machine keeps data sampling control away from areas of data transition. If transition occurs to the right of a data period, then data sampling is done on the left of the data period. If transition occurs to the left of a data period, then data sampling is done on the right of the data period. If transition occurs in the middle of a data period, then sampling continues on the left or right, as before moving to an intermediate state or as defined with respect to such an intermediate state. Sampling stays there until transition is detected on either the left or the right of a data period. If transition is detected on the right, then sampling moves to left sampling, and if transition is detected on the left, then sampling moves to right sampling. Accordingly, sampling is done in a non-transition region by avoiding regions of transition.

Notably, there are no training patterns, rather synchronization to a data stream is done dynamically. Moreover, reliable serial data sampling of wide data buses, up to 64 bits wide, may be done with a single forwarded DDR clock at approximately 622 Mbps to 840 Mbps data rates. Furthermore, multiple data samples per bit may be taken on each bit channel with a single clock or strobe.

While the foregoing is directed to the preferred embodiment of the present invention, other and further embodiments of the invention may be devised without departing from the basic scope thereof, and the scope thereof is determined by the claims that follow. All trademarks are the respective property of their owners.

What is claimed is:

1. A data sampling circuit, comprising:
   a delay line; and
   a plurality of tap circuits coupled to the delay line, the plurality of tap circuits coupled at locations for progressively delaying an input data signal, a tap circuit of the plurality of tap circuits comprising a sampling device and a metastable recovery device, the sampling device and the metastable recovery device coupled in series and configured to receive, sample and stabilize the input data signal progressively delayed, the sampling device of the plurality of tap circuits alternate in triggering from a rising to a falling edge;
   wherein outputs from the plurality of tap circuits provide at least a portion of a vector indicative of a transition region of the input data signal.

2. The data sampling circuit of claim 1 wherein the sampling device and the metastable recovery device are respective flip-flops.

3. The data sampling circuit of claim 1 wherein the sampling device and the metastable recovery device are a flip-flop and a latch, respectively.

4. The data sampling circuit of claim 1 wherein the delay line and the plurality of tap circuits comprise a portion of a programmable logic device.

5. A hybrid data sampling circuit, comprising:
a first delay line having a series of gates, the first delay line having a first plurality of nodes interspersed between the gates, the first plurality of nodes located for tapping a progressively delayed input signal with a first granularity;
a plurality of second delay lines coupled to the first plurality of nodes, each of the plurality of second delay lines having a second plurality of nodes, the second plurality of nodes located for tapping the progressively delayed input signal with a second granularity; and
a plurality of tap circuits coupled to the second plurality of nodes, the plurality of tap circuits including a sampling device and a metastable recovery device, the sampling device and the metastable recovery device coupled in series and configured to receive sample and stabilize the progressively delayed input signal;
wherein outputs from the plurality of tap circuits provide at least a portion of a vector indicative of a transition region of the input data signal.

6. The hybrid data sampling circuit of claim 5 wherein the first delay line is a fine grain delay line, and wherein the plurality of second delay lines are coarse grain delay lines.

7. The data sampling circuit of claim 6 wherein the sampling device and the metastable recovery device are a flip-flop and a latch, respectively.

8. The data sampling circuit of claim 6 wherein the first delay line, the plurality of second delay lines and the plurality of tap circuits comprise a portion of a programmable logic device.

9. A hybrid data sampling circuit, comprising:
a first delay line having a series of a gates, the first delay line having a first plurality of nodes interspersed between the gates, the first plurality of nodes located for tapping a progressively delayed input signal with a first granularity;
a plurality of second delay lines coupled to the first plurality of nodes, the plurality of second delay lines having a second plurality of nodes, the second plurality of nodes located for tapping the progressively delayed input signal with a second granularity; and
a plurality of tap circuits coupled to the second plurality of nodes the plurality of tap circuits including a sampling device and a metastable recovery device, the sampling device and the metastable recovery device coupled in series and configured to receive, sample and stabilize the progressively delayed input signal, the sampling device of the plurality of tap circuits alternate in triggering from a rising to a falling edge;
wherein outputs from the plurality of tap circuits provide at least a portion of a vector indicative of a transition region of the input data signal.

10. A method for determining a transition region of an input signal, comprising:
progressively delaying the input signal;
tapping the input signal progressively delayed at a plurality of locations to provide a plurality of progressively delayed versions of the input signal; and
sampling the plurality of progressively delayed version of the input signal to provide at least a portion of a vector indicative of the transition region of the input signal, the sampling including alternating between toggling on rising and falling edges.

11. The method of claim 10 further comprising stabilizing the input signal sampled.

12. The method of claim 11 wherein the step of stabilizing comprises providing a plurality of outputs representative of at least the portion of the vector all in one domain.

13. The method of claim 12 wherein the one domain is a rising edge domain.

14. The method of claim 13 wherein the step of progressively delaying the input signal comprises a total delay of at least one-half of a data period.

15. The method of claim 13 wherein the step of progressively delaying the input signal comprises a total delay of at least one data period.

16. The method of claim 13 wherein the input signal is a double data rate input signal, and wherein the step of progressively delaying the input signal comprises a total delay of approximately two data periods.

17. The method of claim 10 wherein the input signal is a timing signal selected from a clock and a strobe.

18. A method for determining a transition region of an input signal, comprising:
progressively delaying the input signal;
tapping the input signal progressively delayed at a first plurality of locations to provide a first plurality of progressively delayed versions of the input signal of a first granularity;
progressively delaying each of the first plurality of progressively delayed versions of the input signal of the first granularity to provide a second plurality of progressively delayed versions of the input signal of a second granularity;
tapping the second plurality of progressively delayed versions of the input signal of the second granularity at a second plurality of locations; and
sampling the second plurality of progressively delayed version of the input signal of the second granularity to provide at least a portion of a vector indicative of the transition region of the input signal.

19. The method of claim 18 wherein the first granularity has a finer resolution than the second granularity.

20. A data sampling circuit, comprising:
a delay line; and
a plurality of tap circuits coupled to the delay line, the plurality of tap circuits coupled at locations for progressively delaying an input data signal, a tap circuit of the plurality of tap circuits comprising a logic gate, a sampling device, and a metastable recovery device, the logic gate connected between the delay line and the sampling device, the sampling device and the metastable recovery device coupled in series and configured to receive, sample and stabilize the input data signal progressively delayed, sampling device of the plurality of tap circuits alternate in triggering from a rising to a falling edge;
wherein outputs from the plurality of tap circuits provide at least a portion of a vector indicative of a transition region of the input data signal.

21. The data sampling circuit of claim 20 wherein the sampling device and the metastable recovery device are respective flip-flops.

22. The data sampling circuit of claim 20 wherein the delay line and the plurality of tap circuits comprise a portion of a programmable logic device.

23. The data sampling circuit of claim 20 wherein the delay line comprises a plurality of multiplexers.

24. The data sampling circuit of claim 20 wherein the logic gate comprises an XOR gate.

* * * * *